США012399247B2

United States Patent
Hey et al.

(10) Patent No.: US 12,399,247 B2
(45) Date of Patent: Aug. 26, 2025

(54) ADAPTIVE WATER-FAT SHIFT IN NON-CARTESIAN MAGNETIC RESONANCE IMAGING

(71) Applicant: KONINKLIJKE PHILIPS N.V., Eindhoven (NL)

(72) Inventors: Silke Hey, Best (NL); Giuseppe Valvano, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 126 days.

(21) Appl. No.: 18/275,619

(22) PCT Filed: Jan. 24, 2022

(86) PCT No.: PCT/EP2022/051414
§ 371 (c)(1),
(2) Date: Aug. 3, 2023

(87) PCT Pub. No.: WO2022/167238
PCT Pub. Date: Aug. 11, 2022

(65) Prior Publication Data
US 2024/0103111 A1 Mar. 28, 2024

(30) Foreign Application Priority Data
Feb. 4, 2021 (EP) ..................... 21155162

(51) Int. Cl.
*G01R 33/56* (2006.01)
*G01R 33/48* (2006.01)
(Continued)

(52) U.S. Cl.
CPC ... *G01R 33/56527* (2013.01); *G01R 33/4824* (2013.01); *G01R 33/543* (2013.01)

(58) Field of Classification Search
CPC .......... G01R 33/56527; G01R 33/4824; G01R 33/543
See application file for complete search history.

(56) References Cited

U.S. PATENT DOCUMENTS 10,175,331 B2 * 1/2019 Beck ................. G01R 33/4818
2006/0109004 A1 5/2006 Butts et al.
(Continued)

FOREIGN PATENT DOCUMENTS

EP 341941 A1 12/2018

OTHER PUBLICATIONS

Ryden et al "T1 Weighted Fat/Water Seperated Propeller Acquired With Dual Bandwidths" Magnetic Resonance in Med. vol. 80, No. 6, Apr. 24, 2018 p. 2501-02513.
(Continued)

*Primary Examiner* — G.M A Hyder

(57) ABSTRACT

Disclosed herein is a medical system (100, 300) comprising a memory (110) storing machine executable instructions (120). The medical system further comprises a computational system (104). Execution of the machine executable instructions causes the computational system to: receive (200) initial pulse sequence commands (122), wherein the initial pulse sequence commands are configured for controlling a magnetic resonance imaging system (302) to acquire k-space data (332) following a non-Cartesian k-space sampling pattern (604, 604'), wherein the initial pulse sequence commands are configured for controlling the magnetic resonance imaging system to sample the non-Cartesian k-space sampling pattern by repeatedly sampling a Cartesian k-space sampling pattern (126) that is rotated for each acquisition, wherein the non-Cartesian k-space sampling pattern has an effective water-fat shift direction (606, 606'); receive (202) a chosen water-fat shift direction (124); and construct (204) modified pulse sequence commands by rotating the non-
(Continued)

Cartesian k-space sampling pattern such that the effective water-fat shift direction is aligned with the water-fat shift direction.

15 Claims, 8 Drawing Sheets

(51) Int. Cl.
 *G01R 33/54* (2006.01)
 *G01R 33/565* (2006.01)

(56) References Cited

U.S. PATENT DOCUMENTS

| | | |
|---|---|---|
| 2009/0169084 A1 | 7/2009 | Li et al. |
| 2014/0003694 A1 | 1/2014 | Weng |
| 2015/0212183 A1 | 7/2015 | Beck |
| 2017/0067977 A1 | 3/2017 | Schar et al. |
| 2020/0081086 A1 | 3/2020 | Beck et al. |

OTHER PUBLICATIONS

Schar et al Dixon Water Fat Seperation in Propeller MRI Acquired With Two Interleaved Echos, Magnetic Resonance in Med. vol. 75, No. 2 Mar. 13, 2015 p. 718-728.

International Search Report and Written Opinion from PCT/EP2022/051414 mailed Apr. 4, 2022.

Bley et al "Fat and Water Magnetic Resonance Imaging" Journal of Magnetic Resonance Imaging, Soc. for Magnetic Reson. Imaging, vol. 31, No. 1, Jan. 1, 2010 p. 4-18.

Weng et al "Water-Fat Separation With Parallel Imaging Based on Blade" Magnetic Resonance Imaging, vol. 31, No. 5 Jun. 1, 2013 p. 656-663.

Benkert et al "Free Breathing Volumetric Fat/Water Seperation by Combining Radial Sampling, Compressed Sensing, and Parallel Imaging" Magnetic Resonance in Med. vol. 78, No. 2 Sep. 9, 2016 p. 565-576.

Altbach et al "Chemical Shift Imaging Utilizing the Positional Shifts Along the Readout Gradient Direction" IEEE Transactions on Medical Imaging, vol. 20, No. 11 Nov. 1, 2001.

\* cited by examiner

ADAPTIVE WATER-FAT SHIFT IN NON-CARTESIAN MAGNETIC RESONANCE IMAGING

CROSS REFERENCE TO RELATED APPLICATIONS

This application is a U.S. national phase application of International Application No. PCT/EP2022/051414 filed on Jan. 24, 2022, which claims the benefit of EP Application Serial No. 21155162.7 filed Feb. 4, 2021 and is incorporated herein by reference.

FIELD OF THE INVENTION

The invention relates to magnetic resonance imaging, in particular to non-Cartesian magnetic resonance imaging techniques.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. The acquisition of an MRI image is performed in several steps. First a spatially selected region of interest of the spins within a subject is excited using a RF excitation pulse and gradient magnetic fields. This excited region is then spatially encoded using magnetic field gradient encoding and phase encoding. The direction in which the excited region is encoded using magnetic field gradient is referred to as the readout direction. Due to a chemical shift in the NMR signal, fat and water tissue have slightly different resonant frequencies in the readout direction. This results in a slight spatial shift along the readout direction between where the water and the fat are placed in the image.

United States patent application US 20170067977A1 discloses a magnetic resonance (MR) imaging (MRI) system, the MRI system may include at least one controller which may be configured to: acquire MR information for at least first and second blades of a periodically rotated overlapping parallel lines with enhanced reconstruction (PROPELLER) imaging method; generate, for at least the first and second blades, main field inhomogeneity information based upon the acquired MR information, the main field inhomogeneity information indicating main field inhomogeneity; generate water and fat information individually for at least the first and second blades based upon the acquired MR information and the generated main field inhomogeneity information for the corresponding blade of the first and second blades; and correct at least one of the water and fat information for spatial distortions caused by the main field inhomogeneity or a predetermined chemical shift difference between water and fat.

SUMMARY OF THE INVENTION

The invention provides for a medical system, a computer program and a method in the independent claims. Embodiments are given in the dependent claims.

A disadvantage of magnetic resonance imaging protocols that use non-Cartesian k-space sampling patterns is that the readout direction changes between acquisitions or varies. This results in k-space data being acquired which has a spatial fat water shift in various directions. This may result in blurring of the image as well as producing magnetic resonance images (also referred to herein as magnetic resonance imaging data) that has an unexpected appearance. Radiologists may be accustomed to reading a magnetic resonance image that has the readout direction (and therefore the fat water shift) in a particular direction.

Embodiments may provide for a means of controlling a magnetic resonance imaging system to acquire k-space data using a non-Cartesian k-space sampling pattern such that the reconstructed magnetic resonance image has an appearance equivalent to or approximating an image acquired with a Cartesian k-space sampling pattern. Embodiments acquired the k-space data by using Cartesian k-space sampling patterns that is rotated to different position for each acquisition. This is typically referred to as acquiring the k-space data repeatedly using blades, spokes, or vanes of k-space data. The overall acquisition of k-space data using the non-Cartesian k-space sampling pattern has an effective water-fat shift direction. The angle at which the Cartesian k-space sampling patterns are used can be rotated such that the effective water-fat shift direction matches a chosen water-fat shift direction. In the context of the invention, the effective water-fat shift direction that is dependent on the gradient encoding direction is representative for the direction in which the water-fat shift, or more generally the chemical shift occurs. The effective water-fat shift direction may also be the direction in which the water-fat shift is dominant over the rotated Cartesian k-space sampling patterns For example, the effective read-out direction may be an average of read-out directions of the rotated Cartesian k-space sampling patterns, or a dominant direction of the read-out directions for most of which the rotated Cartesian sampling patterns have a vector-component in common.

In one aspect the invention provides for a medical system that comprises a memory storing machine-executable instructions. The medical system further comprises a computational system. Execution of the machine-executable instructions causes the computational system to receive initial pulse sequence commands. The initial pulse sequence commands are configured for controlling the magnetic resonance imaging system to acquire k-space data following a non-Cartesian k-space sampling pattern. The initial pulse sequence commands are configured for controlling the magnetic resonance imaging system to sample the non-Cartesian k-space sampling pattern by repeatedly sampling a Cartesian k-space sampling pattern that is rotated for each acquisition. The non-Cartesian k-space sampling pattern has an effective water-fat shift direction.

The initial pulse sequence commands could for example be pulse sequence commands which are retrieved from a memory or other storage means. Often times, when a magnetic resonance imaging system is used, pulse sequence commands are retrieved by the operator and then adjusted for the particular acquisition. For example, a region of interest may be selected or adjusted.

Execution of the machine-executable instructions further causes the computational system to construct modified pulse sequence commands by rotating the non-Cartesian k-space sampling pattern such that the effective water-fat shift direction is aligned with the water-fat shift direction.

The direction of the effective water-fat shift direction may have a profound effect on the appearance of the magnetic resonance image. If the magnetic resonance imaging is performed using a Cartesian sampling pattern. The effective water-fat shift direction is aligned with the readout direction. Choosing the water-fat shift direction for a magnetic resonance imaging acquisition may have the effect of producing a magnetic resonance image which is easier for a radiologist to read. The choice of the effective water-fat shift direction may also be useful in minimizing artifacts in the image in critical directions.

In another embodiment the Cartesian sampling pattern has a readout direction. The modified pulse sequence commands comprise readout gradient commands for each rotation of the Cartesian k-space sampling pattern. Each rotation of the Cartesian k-space sampling pattern has a spatial water-fat shift. Execution of the machine-executable instructions further causes the computational system to modify the readout gradient commands to cause a reduction in the spatial water-fat shift as the Cartesian k-space sampling pattern is rotated away from the chosen water-fat shift direction.

In this embodiment the blurring of the magnetic resonance image caused by having k-space data acquired for multiple readout directions can be minimized. The radiofrequency pulse and the gradients can be modified to reduce the spatial water-fat shift. This may have the effect of reducing due to having the water-fat shift in many different directions due to the different readout directions for the different sampling patterns. It may also have the benefit that the magnetic resonance image using the non-Cartesian sampling pattern more resembles a magnetic resonance image that was sampled using a Cartesian k-space sampling pattern.

In another embodiment gradient encodings during readout are adapted so as to rotate the Cartesian k-space sampling pattern away from the chosen water-fat shift direction, so that the spatial water-fat shift decreases as the Cartesian k-space sampling pattern is rotated away from the chosen water-fat shift direction. This embodiment may have the benefit that it more closely resembles a magnetic resonance image acquired with a Cartesian k-space sampling pattern. The adapted gradient encodings may be implemented by modification of the bandwidth of the read-out gradient or by applying a vie angle tilting gradient.

In another embodiment the spatial water-fat shift is decreased as the Cartesian k-space sampling pattern is rotated away from the chosen water-fat shift direction by modifying the readout gradient commands to have an increasing bandwidth. For example, the readout gradient commands can be modified so that they occur over a shorter period of time and have a higher amplitude.

In another embodiment the increasing bandwidth is caused by increasing an amplitude of the readout gradient commands while decreasing a duration of the readout gradient commands. This can for example be performed in a way such that the area or basically the space under a curve form of the gradient remains constant.

In another embodiment the spatial water-fat shift is decreased as the Cartesian k-space sampling pattern is rotated away from the chosen water-fat shift direction by applying a view angle tilting gradient during the readout gradient commands View angle tilting (VAT) gradients is a magnetic resonance imaging technique that has been used successfully to compensate for in-plane distortions caused by the presence of metallic objects, such as implants.

A VAT gradient is an additional magnetic field gradient that is applied in the same direction as the slice select gradient that is applied during readout. The effect of the VAT gradient is that it compensates for the in-plane shift caused by the presence of the metallic object. However, the VAT gradient can be used to also compensate for the water-fat shift.

In another embodiment the view angle tilting gradient is a variable amplitude view angle tilting gradient. An amplitude of the variable amplitude view angle tilting gradient increases as the Cartesian k-space sampling pattern is rotated away from the chosen water-fat shift direction. In this embodiment, the amplitude of the VAT gradient is increased as Cartesian k-space sampling pattern is rotated away from the chosen water-fat shift direction.

One potential advantage to doing this is that the spatial water-fat shift is preserved in the chosen water-fat shift direction. This results in the magnetic resonance image better emulating the water-fat shift in a magnetic resonance imaging that uses just Cartesian sampling. Another potential advantage is that the use of a VAT gradient can result in blurring in the slice select direction. Using a VAT gradient where the amplitude is variable can reduce the effect of this blurring. An important note is that one way of compensating for the blurring in the slice select direction is to increase the readout bandwidth. A potential way of further improving the image quality is to combine the embodiments that use a VAT gradient with the embodiments that increase the bandwidth of the measurement. As the amplitude of the VAT gradient is increased an increasing bandwidth is also used.

In another embodiment the spatial water-fat shift is decreased as the Cartesian k-space sampling pattern is rotated away from the chosen water-fat shift direction by modifying the readout gradient commands to reduce an acquisition voxel size in the readout direction of the Cartesian k-space sampling pattern.

For example, if the strength of the gradient is increased, this may cause the size of the acquisition voxel size to reduce. This may have the effect of reducing the effect of the water-fat shift.

In another embodiment execution of the machine-executable instructions further causes the computational system to determine the effective water-fat direction by averaging the readout direction for each rotation of the Cartesian k-space sampling pattern. For example, the readout direction may be represented by a vector. The effective water-fat direction can then be found by averaging the direction of each of these vectors.

In another embodiment the medical system further comprises a magnetic resonance imaging system. Execution of the machine-executable instructions further causes the computational system to acquire the k-space data by controlling the magnetic resonance imaging system with the modified pulse sequence commands Execution of the machine-executable instructions further causes the computational system to reconstruct magnetic resonance imaging data from the k-space data. This embodiment may be beneficial because it may provide for a magnetic resonance image or magnetic resonance imaging data that has reduced blurring due to the water-fat shift and in other examples it may also provide for a magnetic resonance image that more closely matches the magnetic resonance image using a Cartesian sampling pattern. This may for example be easier for a radiologist to study and interpret.

In another embodiment the magnetic resonance imaging system comprises multiple receive channels. The modified pulse sequence commands are according to a parallel imaging magnetic resonance imaging protocol. The pulse sequence commands are configured to control the magnetic resonance imaging system to acquire k-space data for each of the multiple receive channels. Execution of the machine-executable instructions further causes the computational system to repeatedly reconstruct channel magnetic resonance images from the k-space data for each of the multiple receive channels. The magnetic resonance imaging data is reconstructed from the channel magnetic resonance images according to the parallel imaging magnetic resonance imaging protocol. This embodiment may be beneficial because the image quality can be further improved using the parallel magnetic resonance imaging protocol. Choosing the water-fat shift direction may provide for magnetic resonance images which are of higher quality. This may have a positive effect on the over-parallel magnetic resonance imaging protocol.

In another embodiment the modified pulse sequence commands are configured to acquire k-space data according to a Dixon magnetic resonance imaging protocol. In Dixon magnetic resonance imaging protocol data is acquired at multiple phases and used to prepare a water and fat image. This embodiment may be beneficial because it provides for a means of better separating the water and fat signals. It may therefore provide for an improved means of acquiring Dixon magnetic resonance images using a non-Cartesian k-space sampling pattern.

In another embodiment the modified pulse sequence commands are configured to reconstruct the k-space data according to an iterative compressed sensing algorithm. The iterative compressed sensing algorithm is applied to the entire k-space data or for k-space data acquired for each rotation of the Cartesian k-space sampling pattern. For example, if the compressed sensing algorithm is applied to the entire k-space data as a whole the k-space data acquired may be placed into a conventional compressed sensing algorithm. Alternatively, the k-space data can be reconstructed into image space for each rotation of the Cartesian k-space sampling pattern individually. This may be used to correct the k-space data for each rotation which is then used collectively to reconstruct an image.

In another embodiment the Cartesian k-space sampling pattern is a k-space line.

In another embodiment the Cartesian k-space sampling pattern is a blade of k-space lines. A blade of k-space lines may be interpreted as a group of parallel k-space lines.

In another aspect the invention provides for a computer program comprising machine-executable instructions for execution by a computational system. Execution of the machine-executable instructions causes the computational system to receive initial pulse sequence commands. The initial pulse sequence commands are configured for controlling the magnetic resonance imaging system to acquire k-space data following a non-Cartesian k-space sampling pattern. The initial pulse sequence commands are configured for controlling the magnetic resonance imaging system to sample the non-Cartesian k-space sampling pattern.

The initial pulse sequence commands are configured for controlling the magnetic resonance imaging system to sample the non-Cartesian k-space sampling pattern by repeatedly sampling a Cartesian k-space sampling pattern that is rotated for each acquisition. The non-Cartesian k-space sampling pattern has an effective water-fat shift direction. Execution of the machine-executable instructions further causes the computational system to receive a chosen water-fat shift direction. The chosen water-fat shift direction may for example be specified in a protocol that is received. In other examples it may be received from a user interface or retrieved remotely or from a memory. Execution of the machine-executable instructions further causes the computational system to construct modified pulse sequence commands by rotating the non-Cartesian k-space sampling pattern such that the effective water-fat shift direction is aligned with the water-fat shift direction.

In another aspect the invention provides for a method of operating the medical system. The method comprises receiving initial pulse sequence commands. The initial pulse sequence commands are configured for controlling the magnetic resonance imaging system to acquire k-space data following a non-Cartesian k-space sampling pattern. The initial pulse sequence commands are configured for controlling the magnetic resonance imaging system to sample the non-Cartesian k-space sampling pattern by repeatedly sampling a Cartesian k-space sampling pattern that is rotated for each acquisition. The non-Cartesian k-space sampling pattern has an effective water-fat shifted direction. The method further comprises receiving a chosen water-fat shifted direction. The method further comprises constructing modified pulse sequence commands by rotating the non-Cartesian k-space sampling pattern such that the effective water-fat shift direction is aligned with the water-fat shift direction.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a computational system of a general-purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus.

A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) image or magnetic resonance imaging data is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF EMBODIMENTS

Like numbered elements in these FIGS. are either equivalent elements or perform the same function. Elements which have been discussed previously will not necessarily be discussed in later FIGS. if the function is equivalent.

Figure 1:
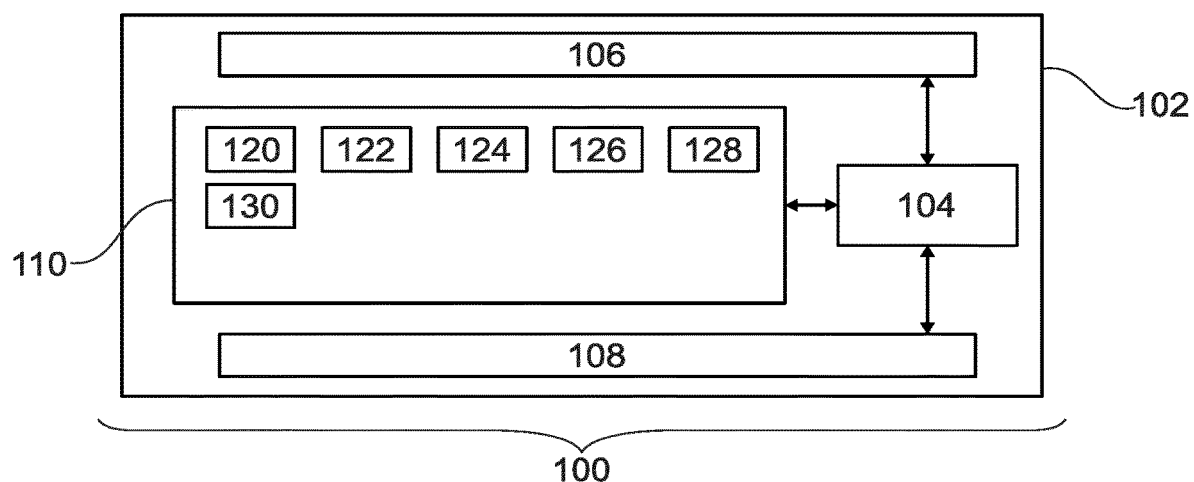
FIG. 1 illustrates an example of a medical instrument.

FIG. 1 illustrates an example of a medical system 100. The medical system 100 is shown as comprising a computer 102 that has a computational system 104. The computational system 104 is intended to represent one or more computational systems or processors or cores that are located at one or more locations. The computational system 104 is shown as being in communication with an optional hardware interface 106, an optional user interface 108 and a memory 110. The hardware interface 106, if present, may enable the computational system 104 to send and receive commands to communicate and/or control other components of the medical system 100. The user interface 108, if present, may enable an operator or user of the medical system 100 to interact with the medical system and/or control it. The memory 110 is intended to represent a variety of memory types which may be in communication with the computational system 104. As such, the memory 110 is intended to represent any memory which the computational system 104 has access to.

The memory 110 is shown as containing machine-executable instructions 120. The machine-executable instructions 120 enable the computational system 104 to control other components via the hardware interface 106 as well as perform various data and numerical and image processing tasks. The memory 110 is further shown as containing initial pulse sequence commands 122. The initial pulse sequence commands 122 could for example be selected when a subject enters a magnetic resonance imaging examination and the operator retrieves the initial pulse sequence commands 122 from a memory. As such, in some examples, the initial pulse sequence commands 122 could be considered to be a template or standard set of pulse sequence commands 122 that are used and then modified by the operator to fit the specific examination.

The memory 110 is further shown as containing a chosen water-fat shift direction 124. These could for example be specified in advance or they could be entered by the user interface 108. The memory 110 is further shown as containing a Cartesian k-space sampling pattern 126. This for example, could be a single line of k-space or a collection of parallel lines such as a blade of k-space. The Cartesian k-space sampling pattern 126 can be rotated to construct a non-Cartesian k-space sampling pattern. The memory 110 is further shown as containing a modified pulse sequence commands 128. The modified pulse sequence commands 128 are the initial pulse sequence commands 122 which have been modified, in particular modifying the non-Cartesian k-space sampling pattern so that its effective water-fat shift direction matches the chosen water-fat shift direction 124. Some examples may also have modified readout gradient commands 130 stored in the memory 110. The readout gradient commands 130 may be modified to use the water-fat shift for the Cartesian k-space sampling pattern 126 when it is not aligned with the chosen water-fat shift direction 124. The modified readout gradient commands 130 may also be incorporated into the modified pulse sequence commands 128.

The readout gradient commands 130 may be modified in a variety of ways. In one example, the bandwidth of the readout gradient commands is increased as the Cartesian k-space sampling pattern is rotated away from the chosen water-fat shift direction. The bandwidth may for example be increased by increasing an amplitude of the readout gradient commands while decreasing a duration of the readout gradient commands.

In yet another example, the readout gradient commands 130 are modified such that the spatial water-fat shift is decreased as the Cartesian k-space sampling pattern is rotated away from the chosen water-fat shift direction by applying a view angle tilting gradient during the readout gradient commands. In another example, the view angle tilting gradient is a variable amplitude view angle tilting gradient, wherein an amplitude of the variable view angle tilting gradient increases as the Cartesian k-space sampling pattern is rotated away from the chosen water-fat shift direction. The use of a variable amplitude view angle tilting gradient may possibly be beneficially combined with the increase in bandwidth as was previously described.

In another example, the readout gradient commands 130 are modified such that the spatial water-fat shift is decreased as the Cartesian k-space sampling pattern is rotated away from the chosen water-fat shift direction by modifying the readout gradient commands to reduce an acquisition voxel size in the readout direction of the Cartesian k-space sampling pattern.

Figure 2:
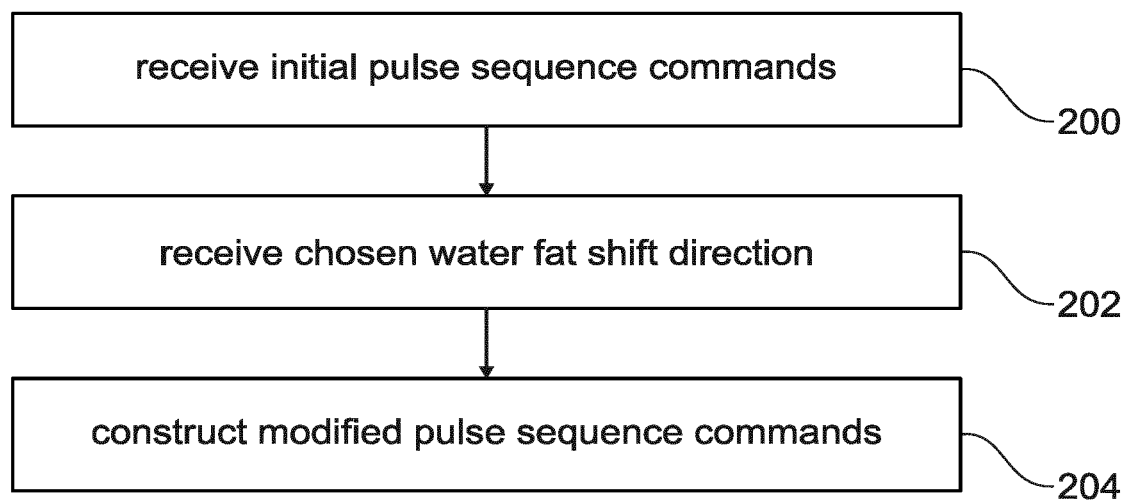
FIG. 2 shows a flow chart which illustrates a method of using the medical instrument of FIG. 1.

FIG. 2 shows a flowchart which illustrates a method of operating the medical system 100 of FIG. 1. First, in step 200, the initial pulse sequence commands 122 are received. Next, in step 202, the chosen water-fat shift direction 124 is received. Finally, in step 204, the modified pulse sequence commands 128 are constructed by rotating the non-Cartesian k-space sampling pattern such that the effective water-fat shift direction is aligned with the chosen water-fat shift direction 124.

Figure 3:
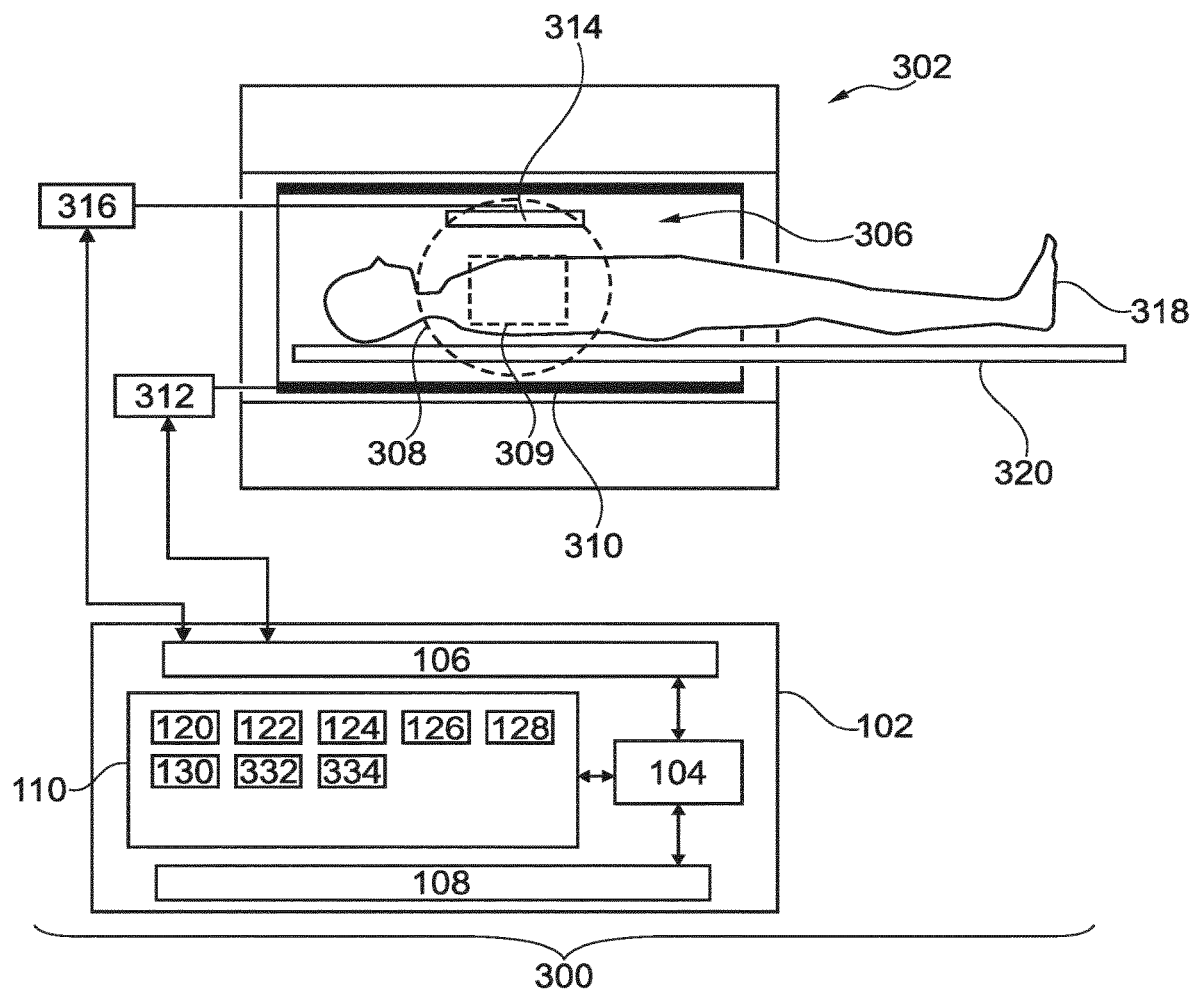
FIG. 3 illustrates a further example of a medical instrument.

FIG. 3 illustrates a further example of a medical system 300. The medical system 300 is similar to the medical system 100 depicted in FIG. 1 except that it additionally comprises a magnetic resonance imaging system 302 that is controlled by the computational system 104.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the cylindrical magnet 304 there is an imaging zone 308 where the magnetic field is strong and uniform enough to perform magnetic resonance imaging. A region of interest 309 is shown within the imaging zone 308. The magnetic resonance data that is acquired typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements.

The transceiver 316 and the gradient controller 312 are shown as being connected to the hardware interface 106 of the computer system 102.

The memory 110 is further shown as comprising k-space data 332 that was acquired by controlling the magnetic resonance imaging system 302 with the modified pulse sequence commands 128. The memory 110 is further shown as containing magnetic resonance imaging data 334 that was reconstructed from the k-space data 332.

Figure 4:
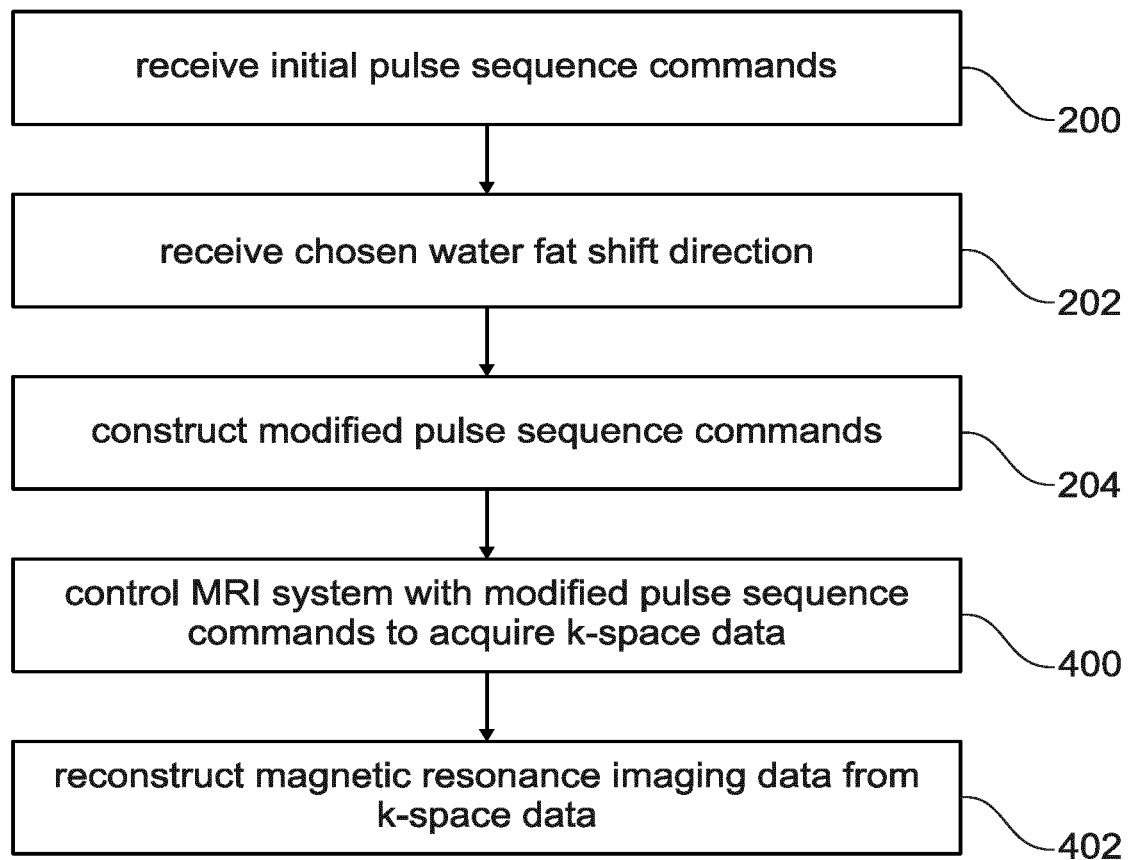
FIG. 4 shows a flow chart which illustrates a method of using the medical instrument of FIG. 3.

FIG. 4 shows a flowchart which illustrates a method of controlling the medical system 300 of FIG. 3. The method depicted in FIG. 4 starts with the first three steps as being equivalent to the steps 200, 202, and 204 as was depicted and described in FIG. 2. After step 204 is performed the method proceeds to step 400. In step 400, the k-space data 332 is acquired by controlling the magnetic resonance imaging system 302 with the modified pulse sequence commands 128. Then finally, in step 402, the magnetic resonance imaging data 334 is reconstructed from the k-space data 332.

In MRI, for non-Cartesian acquisitions like spiral, radial or MultiVane (blade or propeller) the representation of the water-shift is different than for Cartesian scans. This is perceived as a change of contrast and can lead to limited adoption of those techniques with radiologists. Examples may provide for a preferential water-fat shift direction (effective water-fat shift direction) in radial or MultiVane scans by varying the water-fat shift depending on the rotation angle of the blade or spoke.

The water-fat shift present in Cartesian scans contributes to a certain appearance of anatomical features that radiologists are used to and rely on for diagnosis.

Figure 5:
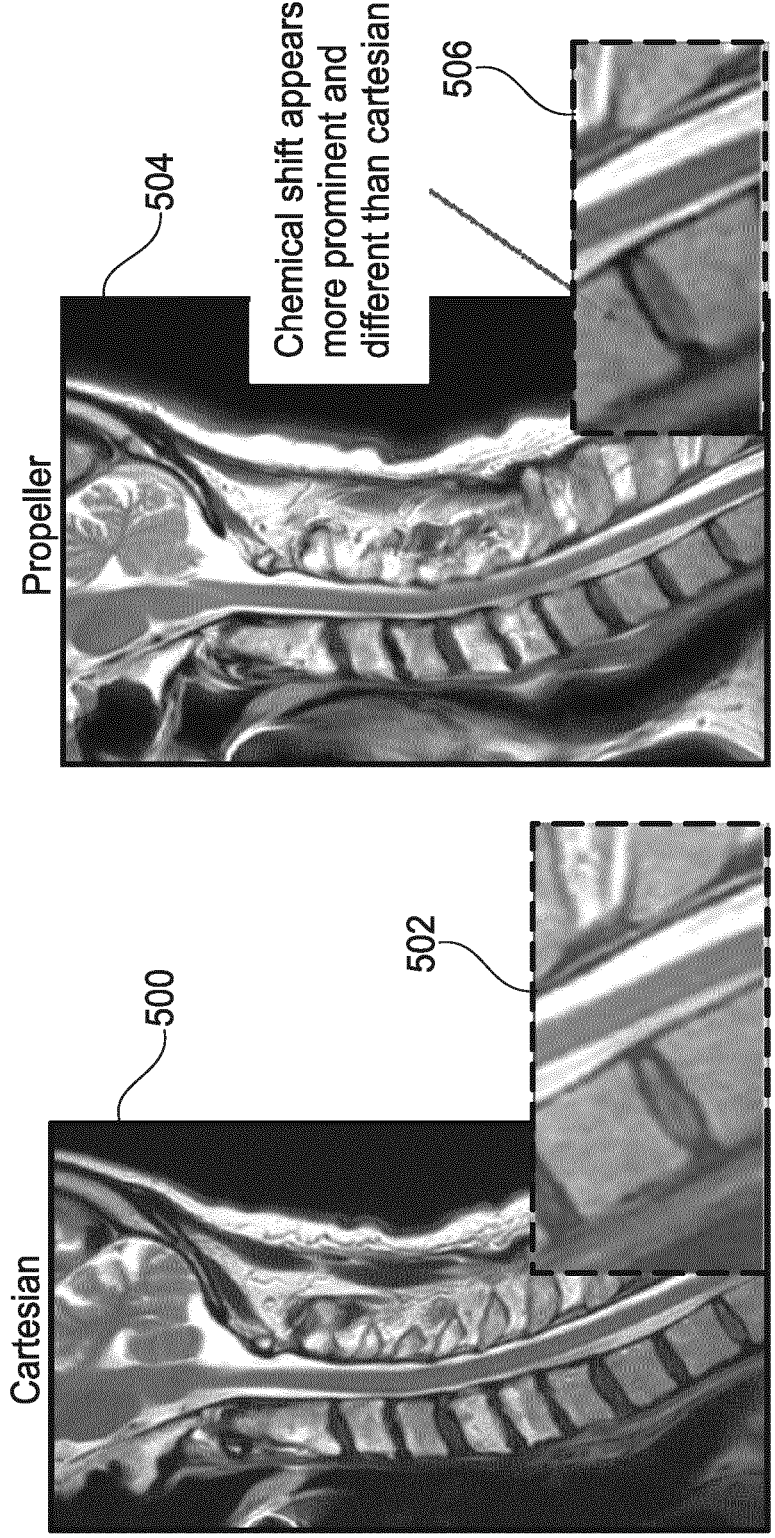
FIG. 5 compares a magnetic resonance image acquired using a Cartesian k-space sampling pattern and a non-Cartesian (propeller) k-space sampling pattern.

FIG. 5 depicts two MRI images 500 and 504. Image 500 is a T2-weighted turbo spin echo MRI image that was sampled using Cartesian sampling of k-space. An enlargement of a region from image 500 is depicted in the adjacent image 502.

Image 504 is a T2-weighted turbo spin echo MRI image that was sampled using a MultiVane sampling pattern of k-space. The MultiVane may also be referred to as a propeller type of sampling pattern. Image 506 is an enlargement of a region from image 504. Comparing images 502 and 506 it can be seen that the fat-water shift or chemical shift appears more prominent in image 506 than in 502.

For radial or MultiVane scans, the readout direction per blade or spoke are adjusted such that the averaged water-fat direction over all profile points in a desired direction. In addition, the readout bandwidth can be adapted per blade/spoke such that elements pointing in the "wrong" direction, have an overall smaller water-fat shift than elements pointing in the "desired" direction.

The underlying cause of the different representation of the water-fat shift in non-Cartesian scans is that the readout direction keeps rotating without any preferential direction. For techniques like spiral, within every single spiral arm the readout direction covers the whole unit circle at least once. Radial and MultiVane on the other hand, use Cartesian readouts as basis. Within every single acquired profile, the readout direction is constant. Since the readout direction per blade/spoke can be chosen freely, it is possible to adjust the direction per blade such that a preferential readout direction is created that points in the direction of the preferred water-fat shift direction.

Figure 6:
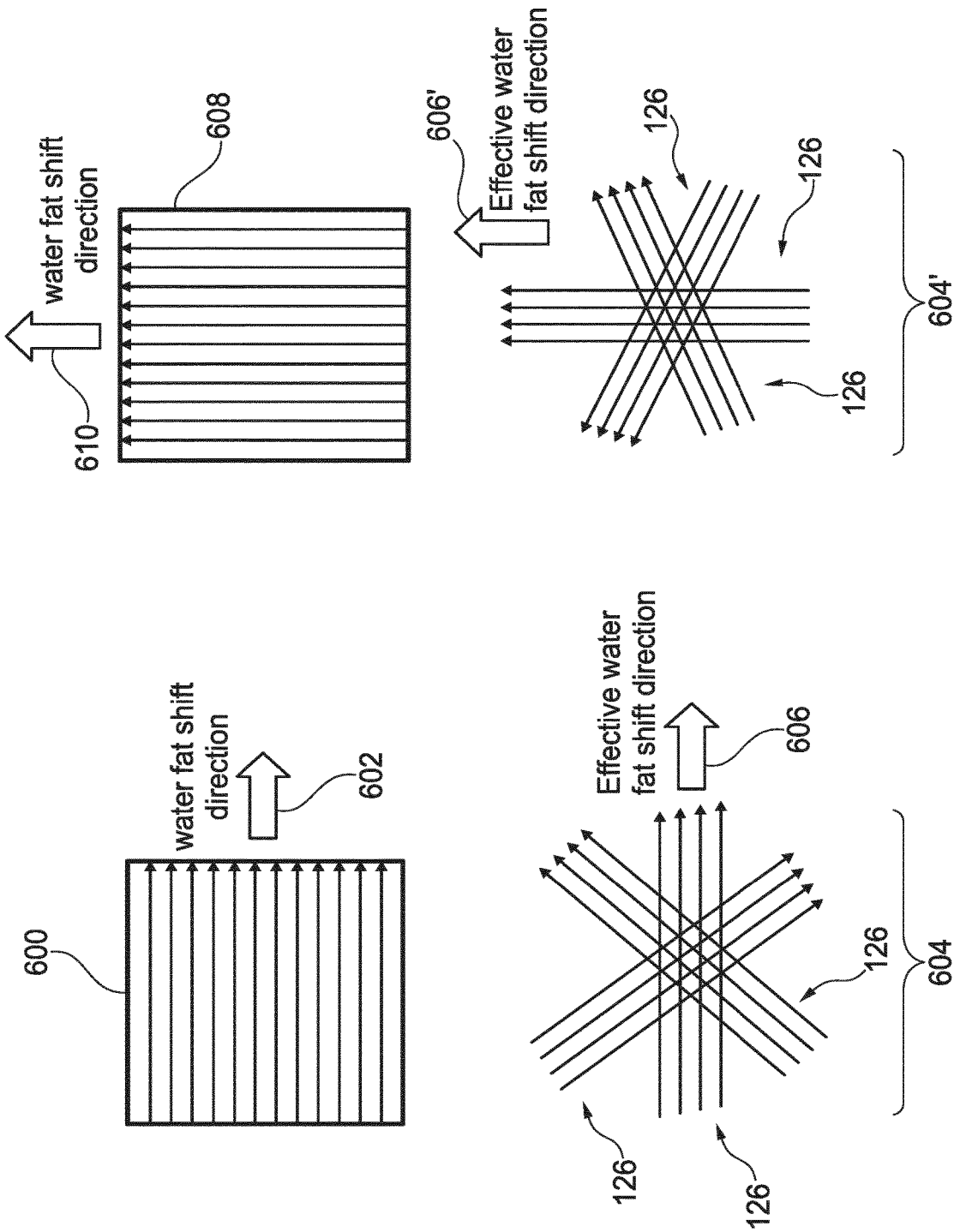
FIG. 6 illustrates the adjustment of the effective water-fat shift direction.

FIG. 6 illustrates the adjustment of the effective water-fat shift direction. On the left-hand side of FIG. 6 there is a first Cartesian k-space sampling pattern 600. This sampling pattern 600 has a first water-fat shift direction 602 which corresponds with the readout direction of the first Cartesian k-space sampling pattern 600. Below this is shown an example of a non-Cartesian k-space sampling pattern 604 that is made up of three Cartesian k-space sampling patterns 126 that are rotated with respect to each other. The average of their readout direction is the effective water-fat shift direction 606. By aligning the effective water-fat shift direction 606 with the water-fat shift direction 602 the image resulting from the non-Cartesian k-space sampling pattern 604 will more closely resemble the image that was acquired using the Cartesian sampling pattern 600.

On the right-hand side of FIG. 6 a further example is shown. In this case there is a second Cartesian k-space sampling pattern 606 with a second water-fat shift direction 610. Below this the same non-Cartesian k-space sampling pattern 604 has been rotated to position 604'. This is achieved by rotating the individual Cartesian k-space sampling patterns 126.

A further similarity of the water-fat shift with Cartesian scans can be achieved by varying the readout bandwidth over blades or spokes. As a result, blades/spokes that point in the "wrong" direction use a larger readout bandwidth (smaller water-fat shift) than blades/spokes pointing in the "desired" direction (chosen water-fat shift direction).

Figure 7:
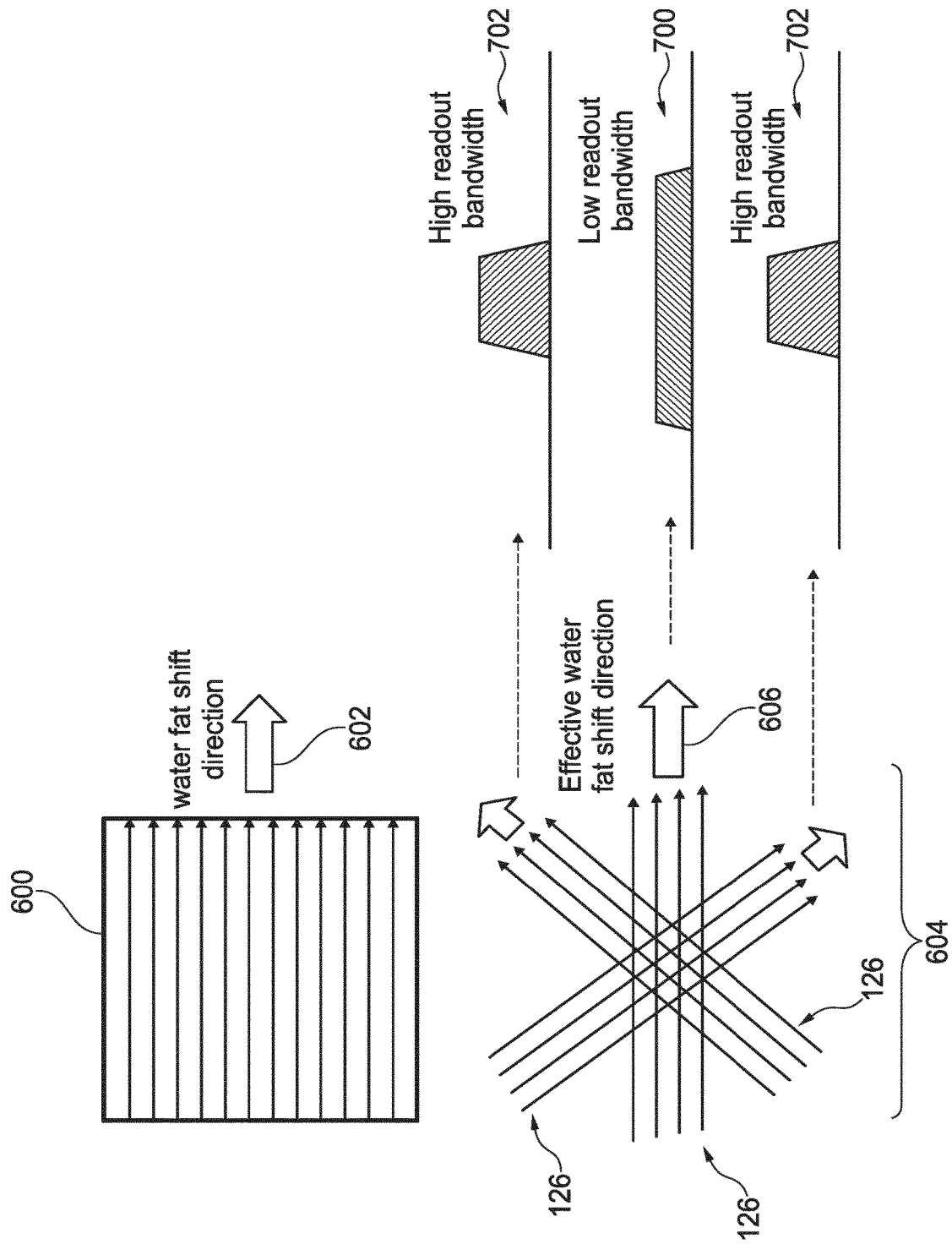
FIG. 7 illustrates the adjustment of the readout gradients.

FIG. 7 illustrates an extension of the scheme illustrated in FIG. 6. In FIG. 7, on the left-hand side the Cartesian k-space sampling pattern 600 and the non-Cartesian k-space sampling pattern 604 are shown again. To the right of the non-Cartesian k-space sampling pattern 604 a modification of the readout gradient commands 700, 702 are illustrated. The Cartesian k-space sampling pattern 126 that is aligned with the effective water-fat shift direction 606 is depicted as having low readout bandwidth gradient commands 700. The other two Cartesian k-space sampling patterns 126 that are not aligned with the effective water-fat shift direction 606 are shown as having high readout bandwidth gradient commands 702. The k-space data acquired with the high readout bandwidth gradient commands 702 will have a reduced water-fat shift. This will cause the image reconstructed from the non-Cartesian k-space sampling pattern 604 to more closely resemble an image acquired with a Cartesian sampling pattern.

In the following, a possible formulation for the involved quantities is presented as function of the rotation angle of the blades/spokes (Cartesian sampling pattern 126).

Let $\theta$ be the rotation angle of the blade/spoke, such that the value $\theta=\pi/2$ corresponds to the desired water-fat shift direction.

Let $|G_R|$ be the magnitude of the readout gradient. The actual readout gradients played for each blade/spoke, in the global coordinate system, will be:

$G_x=|G_R|\cos(\theta)$ $G_y=|G_R|\sin(\theta)$

To achieve the desired effect on the water-fat shift, the readout strength (and analogously also the bandwidth) can be changed so that it is a function of the blade/spoke rotation angle.

$|G_R|(\theta)=|G_{R_{Max}}\cos(\theta)|+|G_{R_{desired}}\sin(\theta)|$

Here $G_{R_{Max}}$ is the max achievable gradient strength (i.e., the one related to the minimum water-fat shift achievable), whilst $G_{R_{desired}}$ is the desired strength (needed to achieve the desired water-fat shift). As a consequence, also the duration T of the trapezoidal gradient waveform and the bandwidth BW will be a function of $\theta$:

$$BW(\theta) = \frac{\gamma}{2\pi}|G_R(\theta)|FOV$$

$$T(\theta) = 1/BW(\theta)$$

Where FOV is the field of view in the readout direction.

Please note that this is one possible formulation, but there could be alternatives (which could have similar performances). Also please note that the formulation here is presented for square field of view, but it could be extended also to the general use case of rectangular FOV.

A further similarity of the water-fat shift with Cartesian scans can be achieved by applying an adaptive view angle tilting (VAT) gradient (or variable amplitude view angle tilting gradient) over blades or spokes. As a result, blades/spokes that point in the "wrong" direction (away from the chosen water-fat direction) will be compensated by the VAT gradient (variable amplitude VAT gradient) more than the ones that point in the correct direction.

Figure 8:
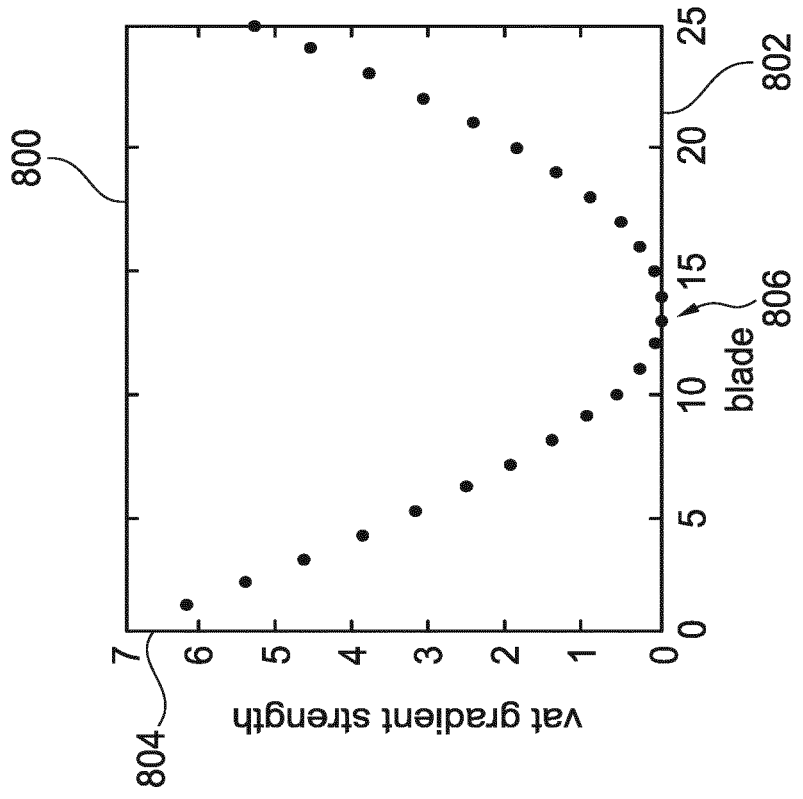
FIG. 8 illustrates the application or use of an adaptive (variable amplitude) VAT.
Figure 8:
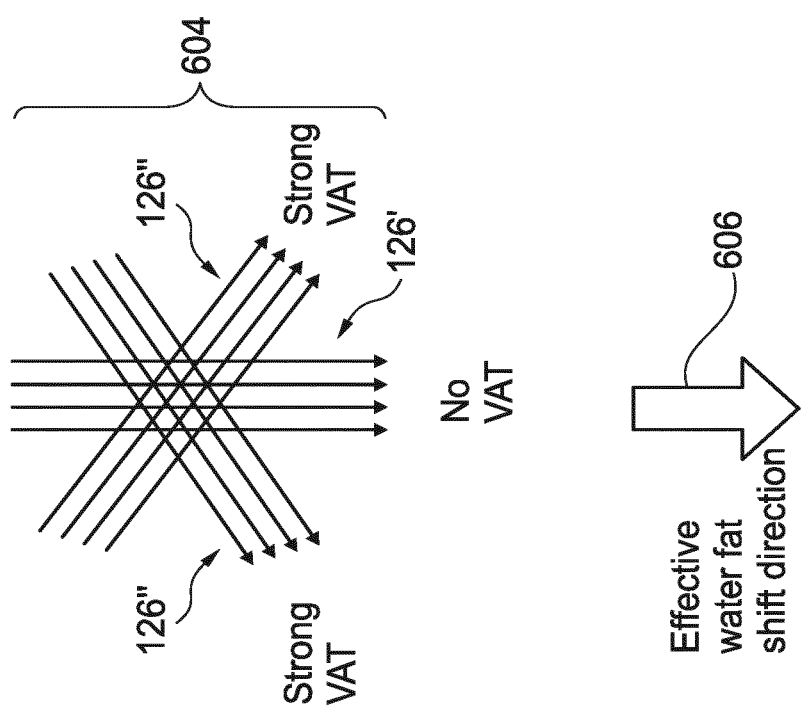

FIG. 8 illustrates the application or use of an adaptive (variable amplitude) VAT. The VAT gradient strength (amplitude) is adjusted so that the blades/spokes pointing in unwanted directions contribute less to the water-fat shift. The effective water-fat direction 606 is shown. The Cartesian k-space sampling pattern 126' points in the effective water-fat direction 606 and has a variable amplitude VAT gradient with an amplitude set to zero or to a minimum value. The other two Cartesian k-space sampling patterns 126" are rotated away from the effective water-fat direction 606 and have a variable amplitude VAT gradient with an amplitude with a value that was larger than for Cartesian k-space sampling pattern 126'.

This is further illustrated in the adjacent plot 800, which is also depicted in FIG. 8. This plot 800 shows the VAT gradient strength used 804 vs as a function of the blade (acquisition) number. The position on the graph 806 indicates the acquisition where the Cartesian sampling pattern 126' is aligned with the effective water-fat direction 606.

In the following a possible formulation for the involved quantities is presented as function of the rotation angle of the blades. Let $\theta$ be the rotation angle of the blade, such that the value $\theta=\pi/2$ corresponds to the desired water-fat shift direction. Let $G_{SMax}$ be the magnitude of the maximum desired VAT gradient. The VAT gradient applied for each blade/spoke could have for example the following formulation:

$G_S(\theta)=G_{SMax}|\cos(\theta)|$

Please note that this is one of the possible formulations, but there could be alternatives (which could have similar performances). Also please note that the formulation here is presented for square field of view, but it could be extended also to the general use case of rectangular FOV. The invention can be applied, for example, to MultiVane imaging as well as radial imaging (possibly also stack of stars trajectory).

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

REFERENCE SIGNS LIST 100 medical system
102 computer
104 computational system
106 optional hardware interface
108 optional user interface
110 memory
120 machine executable instructions
122 initial pulse sequence commands
124 chosen water-fat shift direction
126 Cartesian k-space sampling pattern
126' Cartesian k-space sampling pattern
126 Cartesian k-space sampling pattern
128 modified pulse sequence commands
130 modified readout gradient commands
200 receive initial pulse sequence commands
202 receive a chosen water-fat shift direction
204 construct modified pulse sequence commands by rotating the non-Cartesian k-space sampling pattern such that the effective water-fat shift direction is aligned with the water-fat shift direction
300 medical system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
332 k-space data
334 magnetic resonance imaging data
400 acquire the k-space data by controlling the magnetic resonance imaging system with the modified pulse sequence commands 402 reconstruct magnetic resonance imaging data from the k-space data
500 T2 weighted TSE MRI image from Cartesian sampling of k-space
502 enlargement of region from image 500
504 T2 weighted TSE MRI image from multiVane sampling of k-space
506 enlargement of region from image 504
600 first Cartesian k-space sampling pattern
602 first water-fat shift direction
604 non-Cartesian k-space sampling pattern
604' rotation of non-Cartesian k-space sampling pattern 604
606 effective water-fat shift direction
606' effective water-fat shift direction
608 second Cartesian k-space sampling pattern
610 second water-fat shift direction
700 low bandwidth readout gradient commands
702 high bandwidth readout gradient commands
800 plot of blade vs the amplitude of the VAT gradient
802 blade (acquisition) number
804 VAT gradient strength (amplitude) in arbitrary units

The invention claimed is:

1. A medical system comprising:
a memory storing configured to store machine executable instructions;
a computational system, wherein execution of the machine executable instructions causes the computational system to:
receive initial pulse sequence commands, wherein the initial pulse sequence commands are configured for controlling a magnetic resonance imaging system to acquire k-space data following a non-Cartesian k-space sampling pattern, wherein the initial pulse sequence commands are configured for controlling the magnetic resonance imaging system to sample the non-Cartesian k-space sampling pattern by repeatedly sampling a Cartesian k-space sampling pattern that is rotated for each acquisition, wherein the non-Cartesian k-space sampling pattern has an effective water-fat shift direction being representative for the direction in which the water-fat shift occurs;
receive a chosen water-fat shift direction; and
construct modified pulse sequence commands by rotating the non-Cartesian k-space sampling pattern such that the effective water-fat shift direction is aligned with the water-fat shift direction.

2. The medical system of claim 1, wherein the Cartesian sampling pattern has a readout direction, wherein the modified pulse sequence commands comprise readout gradient commands for each rotation of the Cartesian k-space sampling pattern, wherein each rotation of the Cartesian k-space sampling pattern has a spatial water-fat shift, wherein execution of the machine executable instructions further causes the computational system to modify the readout gradient commands to cause a reduction in the spatial water-fat shift as the Cartesian k-space sampling pattern is rotated away from the chosen water-fat shift direction.

3. The medical system of claim 2, wherein the spatial water-fat shift is decreased as the Cartesian k-space sampling pattern is rotated away from the chosen water-fat shift direction by applying a view angle tilting gradient during the readout gradient commands.

4. The medical system of claim 3, wherein the view angle tilting gradient is a variable amplitude view angle tilting gradient, wherein an amplitude of the variable view angle tilting gradient increases as the Cartesian k-space sampling pattern is rotated away from the chosen water-fat shift direction.

5. The medical system of claim 2, wherein the spatial water-fat shift is decreased as the Cartesian k-space sampling pattern is rotated away from the chosen water-fat shift direction by modifying the readout gradient commands to reduce an acquisition voxel size in the readout direction of the Cartesian k-space sampling pattern.

6. The medical system of claim 2, wherein execution of the machine executable instructions further causes the computational system to determine the effective water-fat direction by averaging the readout direction for each rotation of the Cartesian k-space sampling pattern.

7. The medical system of claim 1, wherein gradient encodings during read-out are adapted to decrease the spatial water-fat shift s with the rotating away from the chosen water-fat shift direction of the Cartesian k-space sampling pattern away.

8. The medical system of claim 7, wherein the spatial water-fat shift is decreased as the Cartesian k-space sampling pattern is rotated away from the chosen water-fat shift direction by modifying the readout gradient commands to have an increasing bandwidth.

9. The medical system of claim 8, wherein the increasing bandwidth is caused by increasing an amplitude of the readout gradient commands while decreasing a duration of the readout gradient commands.

10. The medical system of claim 1, wherein the medical system further comprises a magnetic resonance imaging system, wherein execution of the machine executable instructions further causes the computational system to:
acquire the k-space data by controlling the magnetic resonance imaging system with the modified pulse sequence commands, and
reconstruct magnetic resonance imaging data from the k-space data.

11. The medical system of claim 10, wherein the magnetic resonance imaging system comprises multiple receive channels, wherein the modified pulse sequence commands are according to a parallel imaging magnetic resonance imaging protocol, wherein the pulse sequence commands are configured to control the magnetic resonance imaging system to acquire k-space data for each of the multiple receive channels, wherein execution of the machine executable instructions further causes the computational system to repeatedly reconstruct channel magnetic resonance images from the k-space data for each of the multiple receive channels, wherein the magnetic resonance imaging data is reconstructed from the channel magnetic resonance images according to the parallel imaging magnetic resonance imaging protocol.

12. The medical system of claim 1, wherein the modified pulse sequence commands are configured to reconstruct the k-space data according to an iterative compressed sensing algorithm, wherein the iterative compressed sensing algorithm is applied to the entire k-space data or for k-space data acquired for each rotation of the Cartesian k-space sampling pattern.

13. The medical system of claim 1, wherein the Cartesian k-space sampling pattern is any one of the following: a k-space line and a blade of k-space lines.

14. A computer program comprising machine executable instructions stored on a non-transitory computer readable medium for execution by a computational system, wherein execution of the machine executable instructions causes the computational system to:
receive initial pulse sequence commands, wherein the initial pulse sequence commands are configured for controlling a magnetic resonance imaging system to acquire k-space data following a non-Cartesian k-space sampling pattern, wherein the initial pulse sequence commands are configured for controlling the magnetic resonance imaging system to sample the non-Cartesian k-space sampling pattern by repeatedly sampling a Cartesian k-space sampling pattern that is rotated for each acquisition, wherein the non-Cartesian k-space sampling pattern has an effective water-fat shift direction being representative for the direction in which the water-fat shift occurs;
receive a chosen water-fat shift direction; and
construct modified pulse sequence commands by rotating the non-Cartesian k-space sampling pattern such that the effective water-fat shift direction is aligned with the water-fat shift direction.

15. A method of operating a medical system, wherein the method comprises:
receiving initial pulse sequence commands, wherein the initial pulse sequence commands are configured for controlling a magnetic resonance imaging system to acquire k-space data following a non-Cartesian k-space sampling pattern, wherein the initial pulse sequence commands are configured for controlling the magnetic resonance imaging system to sample the non-Cartesian k-space sampling pattern by repeatedly sampling a Cartesian k-space sampling pattern that is rotated for each acquisition, wherein the non-Cartesian k-space sampling pattern has an effective water-fat shift direction being representative for the direction in which the water-fat shift occurs;
receiving a chosen water-fat shift direction; and
constructing modified pulse sequence commands by rotating the non-Cartesian k-space sampling pattern such that the effective water-fat shift direction is aligned with the chosen water-fat shift direction.

* * * * *